(12) United States Patent
Rantanen

(10) Patent No.: US 6,377,197 B1
(45) Date of Patent: Apr. 23, 2002

(54) DAC GAIN COMPENSATION FOR TEMPERATURE AND PROCESS VARIATIONS

(75) Inventor: Esa Juhani Rantanen, Turku (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/638,371

(22) Filed: Aug. 15, 2000

(51) Int. Cl.[7] .................................................. H03M 1/06
(52) U.S. Cl. ........................ 341/118; 341/119; 341/144; 341/153
(58) Field of Search ................................. 341/118, 119, 341/120, 121, 133, 134, 135, 136, 144, 145, 146, 147, 148, 149, 150, 151, 152, 153, 154

(56) References Cited

U.S. PATENT DOCUMENTS

| | | | |
|---|---|---|---|
| 4,766,415 A | * | 8/1988 | Dielacher .................... 341/144 |
| 4,827,260 A | * | 5/1989 | Sugawa et al. ............. 341/118 |
| 5,748,127 A | | 5/1998 | Prakash et al. |
| 5,909,187 A | | 6/1999 | Ahuja |

FOREIGN PATENT DOCUMENTS

JP   09-284135 A   * 10/1997   ............ H03M/1/74

* cited by examiner

Primary Examiner—Howard L. Williams
(74) Attorney, Agent, or Firm—Ware, Fressola, Van Der Sluys & Adolphson LLP

(57) ABSTRACT

A compensation circuit and method cancels transmit digital-to-analog (DAC) gain variations in a wireless communication device. A transmit DAC produces an output current signal $I_{load}$ load proportional to a reference current $I_{ref}$ which is inversely proportional to a load resistance $R_{load}$ whereby the DAC output current signal $I_{load}$ inversely tracks changes in the load resistance due to manufacturing process and temperature to cancel gain variations. The load resistor $R_{load}$ and reference resistor $R_{ref}$ are preferably located on the same IC and made of the same material. The transmit DAC includes a current steering cell which receives the reference current $I_{ref}$ to produce the output current signal $I_{load}$ in proportion of the reference current $I_{ref}$.

6 Claims, 2 Drawing Sheets

DAC GAIN COMPENSATION FOR TEMPERATURE AND PROCESS VARIATIONS

BACKGROUND OF THE INVENTION

The present invention relates generally to digital-to-analog converters (DAC) used in wireless communication devices and deals more particularly with a method and compensation circuit for canceling transmit DAC gain variations in such wireless communication devices due to variations in the manufacture process and temperature.

The use of wireless communication devices such as cellular telephones has increased tremendously over the last several years and such use is expected to continue to increase, particularly due to wireless connection to the Internet or other such global network services. One key component of these wireless communication devices is the digital-to-analog converter (DAC). The transmission architecture of wireless devices generally includes some type of digital circuitry which generates a bit stream which is converted to an analog signal by the DAC, and which signal is mixed up to the RF frequency for transmission by the RF power amplifier. The transmit power gain may vary from unit-to-unit due to numerous reasons, such as, for example, the tolerances of the analog components in the transmit chain including the transmit DAC, which is required between the digital base band and analog RF sections.

Typical cellular telephone designs attempt to locate the transmit DAC and RF components in different physical locations in the cellular telephone to avoid interference. One drawback of this design approach is that the process variations in the manufacturing phase of the components do not track one another. In a worst case scenario, the transmit DAC and RF components have a maximum variation in the same direction which results in a maximum total transmit gain deviation from the nominal transmit gain value.

Previous approaches for compensating for transmit gain variation from one unit to another has been to calibrate out the variation in production. One such method for calibrating out variations is to find, empirically or otherwise, control signal values that result in acceptable transmit power levels and then storing such control signal values in digital format in a non-volatile memory for subsequent retrieval during the transmission process to maintain the transmit power within acceptable levels.

Another drawback of typical cellular telephone designs is the requirement for a complex circuit design for the transmit DAC and the load circuitry driven by the DAC to compensate for transmit gain variation. The transmit DAC output variation must be minimized and the load circuitry must be capable of tolerating different input signal levels. Such requirements generally lead to higher power consumption in both the transmit DAC and the load circuitry.

Some success has been achieved in calibrating certain DAC topologies using laser trimming in production, however, such laser trimming cannot be applied to all DAC designs and topologies and does not cancel or compensate variations in the output signal due to temperature drift.

Accordingly, it is an object of the present invention to provide a method and compensation circuit for canceling transmit DAC gain variations due to DAC process and temperature variations

SUMMARY OF THE INVENTION

A method and compensation circuit for canceling transmit DAC gain variations in a wireless communication device due to manufacturing process and temperature variations is presented in accordance with the present invention wherein a transmit DAC produces an output current signal $I_{load}$ proportional to a reference current $I_{ref}$ wherein the reference current $I_{ref}$ is inversely proportional to a load resistance $R_{load}$ whereby the DAC output current $I_{load}$ inversely tracks changes in the load resistance $R_{load}$ to cancel gain variations.

In a further aspect of the invention, the reference current $I_{ref}$ is generated in an integrated circuit containing the load resistance $I_{ref}$ and by providing a reference voltage $V_{ref}$ to an input of an operational amplifier and coupling the output to a reference resistance $R_{ref}$ and a current source to generate the reference current $I_{ref}$.

The load resistance $R_{load}$ and reference resistance $R_{ref}$ are made of the same material.

In a yet further aspect of the invention, the transmit DAC includes a current steering cell for receiving the reference current $I_{ref}$ to produce the output current signal $I_{load}$ in proportion to the reference current $I_{ref}$.

BRIEF DESCRIPTION OF THE DRAWINGS

Other features and advantages of the present invention will become readily apparent from the following description and drawings wherein.

DETAILED DESCRIPTION OF THE PREFERRED EMBODIMENTS

Figure 1:
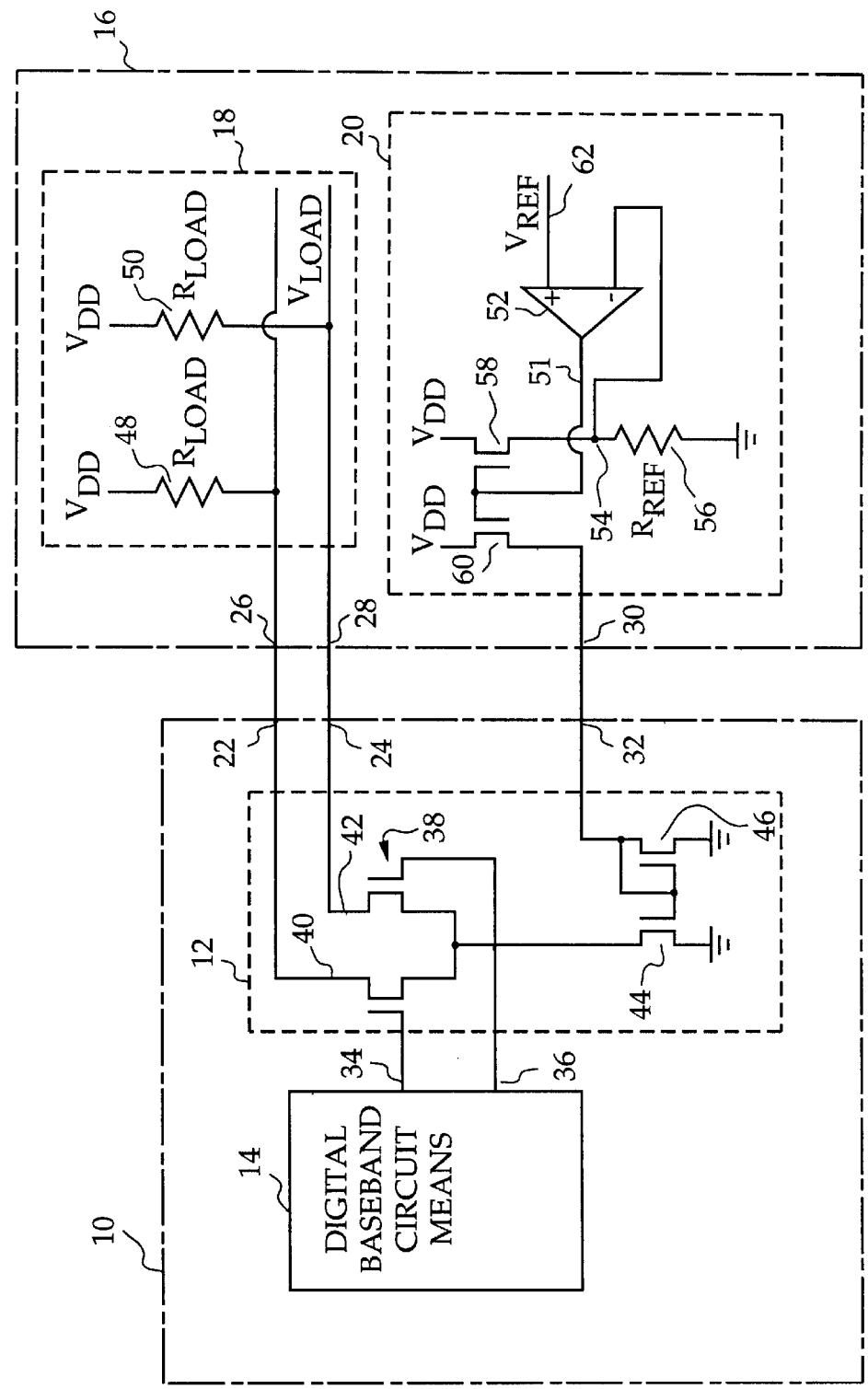
FIG. 1 is a schematic and block diagram of the DAC of the invention.

Turning now to the drawings and considering the invention in further detail, a schematic and block diagram of the transmit DAC driving a resistive load and embodying the present invention is illustrated in FIG. 1. In FIG. 1, the transmit DAC, is generally represented by the enclosed dash line box 12, and which for purposes of this disclosure is considered to be part of an integrated circuit referred to as a "DAC IC," located within the dash line box 10. The DAC IC 10 also includes digital base band circuitry means shown generally as the function block 14. The DAC IC 10 is coupled to a "load IC," generally designated 16, which contains the resistive load circuitry generally shown within the dash line box 18 and a reference current generating circuit means shown generally within the dash line box 20. Both the resistive load and current generating circuits are considered part of the integrated circuit referred to as the load IC.

The DAC IC 10 has output leads 22, 24 coupled to the load leads 26, 28 respectively of the load circuit 18 of the load IC 16. The reference current generating circuit means 20 provides a reference current $I_{ref}$ at the load IC output 30 which output is coupled to the input 32 of the DAC IC 10. The digital base band circuitry 14 has a differential output 34, 36 and provides the data bit stream input to a current steering cell generally designated 38 of the transmit DAC 12. Source terminals 40, 42 of the current steering cell 38 are coupled to the DAC IC 10 output terminals 22, 24, respectively. Transistors 44, 46 are the current source transistors for the current steering cell 38. Transistor 46 is configured as a diode and is coupled to the input 32 of the DAC IC 10 to receive the $I_{ref}$ reference current generated by the reference current generating circuit 20 in the load IC 16.

In the illustrated embodiment, the resistive load 18 comprises a resistor $R_{load}$ 48 having one end coupled to the input load terminal 26 of the load IC 16 and a resistor $R_{load}$ 50 having one end connected to input load terminal 28 of the load IC 16. The opposite ends of resistors 48, 50 are connected to a voltage source $V_{dd}$.

The reference current generating circuit means 20 comprises an operational amplifier 52 having its output 51 coupled to the gates of current source transistors 58, 60. The source terminal of transistor 60 provides the $I_{ref}$ reference current to the output terminal 30 of the load IC 16. A reference voltage $V_{ref}$ is provided to the positive input 62 of the operational amplifier 52 to generate the reference current $I_{ref}$. The $R_{ref}$ resistor 56 must be of the same material as the load resistor $R_{load}$ of the transmit DAC in order to track one another as their respective resistance values change due to temperature variation. Preferably, the $R_{ref}$ reference resistor and $R_{load}$ load resistor are part of the same integrated circuit such as the load IC 16 shown in the illustrated embodiment.

It will be understood that the connection between the DAC IC 10 and the load IC 16 is preferably made utilizing printed circuit board (PCB) wiring techniques well known to those skilled in the art of integrated circuit component connection. Such PCB connections allows the transmit DAC and RF components to be separated physically to avoid interference. The DAC IC 10 can be designed using MOS transistors in the present invention because the DAC output is a current and does not have to be converted to a voltage. It is preferable to drive the resistive load with a current rather than a voltage because a current signal is generally more tolerant to interference than a voltage signal if the PCB routing is done properly. In addition, a current signal is less likely to interfere with other signals than would a large magnitude high frequency voltage signal.

The following will show that the transmit DAC gain variation can be cancelled if the DAC output signal level inversely tracks the load variation. The tracking can be accomplished, for example, if the output of the DAC is a current which is proportional to a reference current generated in the integrated circuit containing the load resistance. The reference current is inversely proportional to the load resistance. In the illustrated embodiment, $V_{load}$ represents the voltage value which is an input to the rest of the transmit channel and has a certain digital signal value k. In the ideal case, the process variation coefficient kp is cancelled and the load voltage of $V_{load}$ is proportional to constant quantities. The following equations are proof that $V_{load}$ is proportional to constant quantities.

(1) $V_{load} = V_{dd} - R_{load} \times I_{load}$ (2) $V_{load} = V_{dd} - kp \times R_{load_{nom}} \times k \times I_{ref}$ (3) $V_{load} = V_{dd} - kp \times R_{load_{nom}} \times k \times \frac{V_{ref}}{R_{ref}}$ (4) $V_{load} = V_{dd} - kp \times R_{load_{nom}} \times k \times \frac{V_{ref}}{kp \times R_{ref_{nom}}}$ (5) $V_{load} = V_{dd} - k \times \frac{R_{load_{nom}}}{R_{ref_{nom}}} \times V_{ref}$ Thus, it is shown that $V_{load}$ is proportional to constant quantities and further that $R_{load}$ and $R_{ref}$ will track each other proportionally to compensate for changes in resistance due to temperature when both $R_{load}$ and $R_{ref}$ are made of the same physical material.

Figure 2:
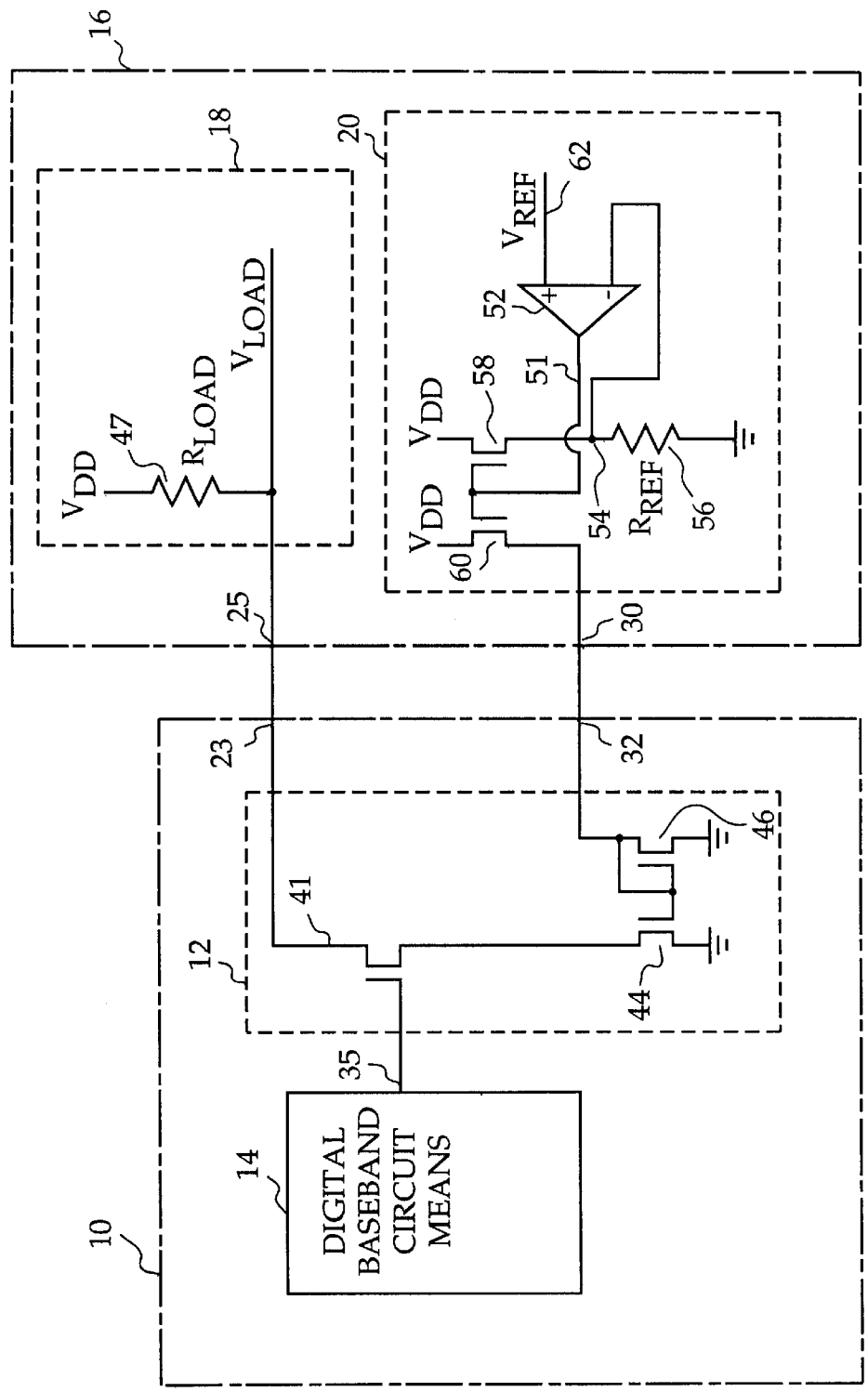
FIG. 2 is a schematic and block diagram of an alternate embodiment of the DAC of the invention.

FIG. 2 is a schematic and block diagram of an alternate embodiment of the DAC of the invention and is similar to FIG. 1 with the exception that in the output of the DAC IC is a single-ended signal. In this case, the output of the current steering cell 41 is coupled to the output 23 of the DAC IC 10 and connected to the load terminal 25 of the load IC 16 to drive the load resistor $R_{load}$ 47. The reference current $I_{ref}$ is supplied to the current steering cell 41 via the transistor 44. As will be seen from the above proof, the same method utilized in the embodiment of FIG. 1 applies to the embodiment of FIG. 2 with the same results.

As will be understood by those skilled in the art, numerous changes and modifications in the method and apparatus described above may be made by those skilled in the art of integrated circuit design and DAC design without departing from the spirit and scope of the invention. Therefore, the present invention has been shown by way of illustration rather than limitation.

What is claimed is:

1. Method for canceling digital-to-analog converter DAC gain variations in a circuit having a transmit DAC driving a load resistance comprising the steps of:

generating in a first integrated circuit a reference current $I_{ref}$ inversely proportional to a load resistance $R_{load}$ in said first integrated circuit containing the load resistance; and coupling the reference current $I_{ref}$ to a current steering cell in a transmit DAC in a second integrated circuit;

producing a transmit DAC output current signal $I_{load}$ in second integrated circuit proportional to said reference current $I_{ref}$ whereby said transmit DAC output current signal $I_{load}$ in said second integrated circuit inversely tracks changes in the load resistance $R_{load}$ in said first integrated circuit to cancel gain variations due to manufacturing process tolerances and temperature drift in said transmit DAC.

2. Method for canceling DAC gain variations as defined in claim 1, wherein the step of generating a reference current further comprises:

providing a reference voltage $V_{ref}$ to an input of an operational amplifier circuit means;

coupling the output of said operation amplifier circuit means to a reference resistor $R_{ref}$ and a current source for generating said reference current $I_{ref}$.

3. Method for canceling DAC gain variations as defined in claim 2, further including making the load resistance $R_{load}$ and the reference resistance $R_{ref}$ of the same material.

4. A digital-to-analog (DAC) gain variation compensation circuit comprising:

a first integrated circuit including transmit DAC circuit means having an input for receiving a digital signal bit stream for conversion to an analog output current signal;

a second integrated circuit including load circuit means having a load resistance $R_{load}$ coupled to said first integrated circuit transmit DAC for receiving said analog output current signal;

said second integrated circuit further including current generating circuit means for producing a reference current $I_{ref}$ having a magnitude inversely proportional to said load resistance $R_{load}$; and said first integrated circuit transmit DAC further including a current steering cell coupled to said second integrated circuit current generating circuit means for receiving said reference current $I_{ref}$ to produce said output analog current signal in proportion to said reference current $I_{ref}$ whereby said transmit DAC output analog current signal inversely tracks changes in said load resistance $R_{load}$ to cancel gain variations due to manufacturing process tolerances and temperature drift in said transmit DAC.

5. A digital-to-analog (DAC) gain variation compensation circuit as defined in claim 4, wherein said second integrated circuit current generating circuit means further comprises a reference voltage $V_{ref}$, a reference resistor $R_{ref}$, an operational amplifier having an input coupled to the reference voltage $V_{ref}$ and an output coupled to the reference resistor $R_{ref}$ and a source of current to generate said reference current $I_{ref}$.

6. A digital-to-analog (DAC) gain variation compensation circuit as defined in claim 5, wherein said reference resistor $R_{ref}$ and said load resistor $R_{load}$ are made of the same material.

* * * * *